(12) United States Patent
Chen (10) Patent No.: US 11,140,792 B2
(45) Date of Patent: Oct. 5, 2021

(54) DISPLAY DEVICE

(71) Applicant: AU OPTRONICS CORPORATION, Hsin-Chu (TW)

(72) Inventor: Po-Chun Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 47 days.

(21) Appl. No.: 16/684,631

(22) Filed: Nov. 15, 2019

(65) Prior Publication Data

US 2020/0187369 A1 Jun. 11, 2020

Related U.S. Application Data

(60) Provisional application No. 62/775,480, filed on Dec. 5, 2018.

(30) Foreign Application Priority Data

Feb. 27, 2019 (TW) .................................. 108106906

(51) Int. Cl.
*H05K 5/00* (2006.01)
*H05K 1/18* (2006.01)
(Continued)

(52) U.S. Cl.
CPC ........... *H05K 5/0017* (2013.01); *H05K 1/189* (2013.01); *H05K 5/0217* (2013.01); *H05K 2201/056* (2013.01); *H05K 2201/10128* (2013.01)

(58) Field of Classification Search
CPC .... H05K 5/0017; H05K 5/0217; H05K 1/189; H05K 2201/056; G02F 1/13332; G02F 1/133308; G09F 9/30
See application file for complete search history.

(56) References Cited

U.S. PATENT DOCUMENTS 7,050,127 B2 5/2006 Ishiwa
9,217,889 B2 12/2015 Li
(Continued)

FOREIGN PATENT DOCUMENTS

CN 202502322 U 10/2012
CN 103018937 B 8/2015
(Continued)

OTHER PUBLICATIONS

TW OA issued on Feb. 14, 2020.

*Primary Examiner* — Timothy J Thompson
*Assistant Examiner* — Amol H Patel
(74) *Attorney, Agent, or Firm* — WPAT, PC (57) ABSTRACT

A display device including a display panel, an extension plate, and a spacing plate is provided. The display panel has a first substrate, a second substrate, and a flexible connecting unit. The second substrate is stacked on the first substrate and has an outer surface. The first substrate has a protruding portion extended out of the second substrate. The protruding portion has a protruding surface connected to the flexible connecting unit. The extension plate is stacked on the outer surface and has a portion extending out of the outer surface and being stacked on the protruding portion. A gap is formed between the extension plate and the flexible connecting unit. The spacing plate partially enters into the gap to be located between the flexible connecting unit and the extension plate.

21 Claims, 6 Drawing Sheets

(51) Int. Cl.
  *H05K 5/02* (2006.01)
  *G02F 1/1333* (2006.01)
  *G02F 1/1339* (2006.01)
  *G02F 1/1335* (2006.01)
  *G09F 9/30* (2006.01)

(56) References Cited

U.S. PATENT DOCUMENTS

2001/0002145 A1* 5/2001 Lee .................. G02F 1/133308
                                                        349/58
2019/0285933 A1   9/2019 Chien et al.

FOREIGN PATENT DOCUMENTS

| GN | 105572943 A  | 5/2016  |
| GN | 106707582 A  | 5/2017  |
| GN | 104486571 B  | 10/2018 |
| TW | I344038 B    | 6/2011  |
| TW | 201219896 A1 | 5/2012  |
| TW | I472838 B    | 2/2015  |

* cited by examiner

DISPLAY DEVICE

BACKGROUND OF THE INVENTION

1. Field of the Invention

The present invention discloses a display device; in particular, the present invention discloses a display device which has an extension plate displosed at the end of of display panel.

2. Description of the Prior Art

In recent years, various display devices have been used in daily life. Devices such as televisions, computers, cell phones, TV game devices and vehicle devices all include display devices. In terms of the development of display device technologies, we have seen the trend towards large display area and narrow frame or no-frame in hope of a better visual experience.

In the pursuit of narrow frame or no-frame display device designs, conventional designs keep on reducing frame thickness of the device to achieve a better visual experience. However, it is more difficult for a thinner frame to cover the outer surface of the display panel. As a result, the interface between the frame and the display panel can be easily noticed by the user. In order to reduce the impact of the aforesaid interface on the user's visual experience, the design will try to minimize the distance between the edge of the display panel and the frame. However, in consideration of assembly tolerance and the possibility of the frame being pressed against the display panel due to outer force, a gap is preserved between the frame and the edge of the display panel. Because of the gap, users may see the components and wires inside the display device through the gap, and such experience may impact the user's opinion of the quality of the product appearance.

SUMMARY OF THE INVENTION

One of the purposes of the present invention is providing a display device to reduce the possibility of the user noticing the inner components of the device.

One of the purposes of the present invention is providing a display device having a better appearance and visual effect.

One of the purposes of the present invention is providing a display device configured to reduce damage to the display panel or other inner components when impact to the frame body occurs.

In an embodiment, the display device has a display panel, an extension plate and spacing plate. The display panel has an outer surface and a first end and comprises a first substrate, a second substrate and a flexible connecting unit. The second substrate is stacked on the first substrate. The outer surface is formed on a surface of the second substrate facing away from the first substrate. At the first end of the display panel, the first substrate has a protruding portion extending beyond the second substrate. The protruding portion has a protruding surface facing a virtual plane formed by extending the outer surface. The flexible connecting unit is connected to the protruding surface. The extension plate is partially stacked on the outer surface and partially extended out of the outer surface to be stacked on the protruding portion of the first substrate. A gap is formed between the extension plate and the flexible connecting unit. The spacing plate is partially extended into the gap to be located between the flexible connecting unit and the extension plate. With this arrangement, the spacing plate can visually cover the protruding surface and the flexible connecting unit to provide a better visual effect of appearance.

In an embodiment, the display device has a display panel, an extension plate and a frame body. The display panel has an outer surface and a first end. The extension plate is partially stacked on a part of the outer surface near the first end and has an extension part protruding outside the outer surface. The frame body is disposed corresponding to the first end. At least a portion of the extension part is bent toward a direction opposite the facing direction of the outer surface to form a bending section. The bending section is extended toward the frame body. Accordingly, when the frame body presses against an end of the extension plate due to an external force, the external force will not be directly and completely transferred to the display panel. The bending section can eliminate a part of the external force transferred to the display panel with its inclination angle.

In an embodiment, the display device has a display panel, an extension plate, a frame body and a buffer material. The display panel has an outer surface and a first end. The extension plate is partially stacked on a part of the outer surface near the first end. The extension plate has an extension part protruding outside the outer surface. The frame body is disposed corresponding to the first end. A clearance is formed between the frame body and an end of the extension part. The frame body has an inner wall. The buffer material is disposed between the inner wall and the first end. On a virtual plane formed by extending the outer surface, the buffer material has a first projection area and the clearance has a second projection area. Wherein the first projection area at least partially overlaps the second projection area. With this arrangement, when the user observes the clearance from the outside, the buffer material will cover the inner components to improve the appearance

DETAILED DESCRIPTION OF THE PREFERRED EMBODIMENT

The connecting elements according to the present invention will be described in detail below through embodiments and with reference to the accompanying drawings. A person having ordinary skill in the art may understand the advantages and effects of the present disclosure through the contents disclosed in the present specification. However, the contents shown in the following sentences never limit the scope of the present disclosure. Without departing from the conception principles of the present invention, a person having ordinary skill in the present art may realize the present disclosure through other embodiments based on different views and applications. In the attached Figures, for the purpose of clarification, the thicknesses of layers, films, panels, regions and the like are amplified. In the whole specification, the same marks represent the same element. It should be understood that, when an element such as a layer, a film, a panel, a region or a substrate are described as "being on" or "being connected to" another element, they may be directly on or connected to another element, or there may be other elements therebetween. On the other hand, when an element is described as "directly exists on another element" or "directly connects to another element", there is no element therebetween. As used in the present specification, a "connection" may be a physical and/or electrical connection. In addition, an "electrical connection" or "coupling" means that other elements may exist therebetween.

It should be understood that, even though the terms such as "first", "second", "third" may be used to describe an element, a part, a region, a layer and/or a portion in the present specification, but these elements, parts, regions, layers and/or portions are not limited by such terms. Such terms are merely used to differentiate an element, a part, a region, a layer and/or a portion from another element, part, region, layer and/or portion. Therefore, in the following discussions, a first element, portion, region, layer or portion may be called a second element, portion, region, layer or portion, and do not depart from the teaching of the present disclosure.

In addition, relative terms such as "lower" or "bottom" and "on" or "top" may be used to describe the relationship between an element and another element in the present specification, as shown in the Figures. It should be understood that, the purpose of using relative terms is to include the different directions of the devices not shown in the Figures. For example, if a device in an attached Figure is turned upside down, an element described as being "under" another element will be "on top of" that element. Therefore, a descriptive term "under" may include the meaning of both "under" and "on top of", depending on the specific orientation of the attached Figure.

The terms "about", "approximate" or "essentially" used in the present specification include the value itself and the average values within the acceptable range of deviation of the specific values confirmed by a person having ordinary skill in the present art, considering the specific measurement discussed and the amount of errors related to such measurement (that is, the limitation of the measurement system). For example, "about" may mean within one or more standard deviations of the value itself, or within ±30%, ±20%, ±10% or ±5%. In addition, "about", "approximate" or "essentially" used in the present specification may select a more acceptable range of deviation or standard deviation based on optical property, etching property or other properties. One cannot apply one standard deviation to all properties.

Figure 1:
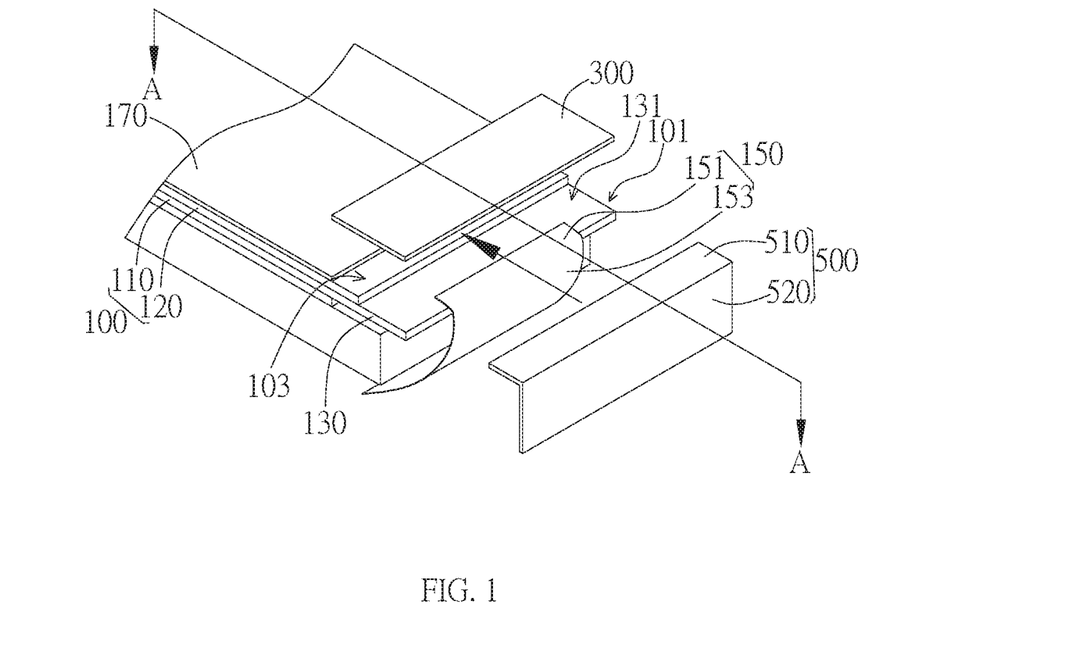
FIG. 1 is an exploded-view drawing of a display device according to an embodiment of the present invention.

FIG. 1 shows a display device according to an embodiment. In the embodiment, the display device comprises a display panel 100, an extension plate 300 and a spacing plate 500. The display panel 100 is preferably but not limited to a liquid display panel. The display panel 100 can also be a self-emitting display panel or other panels with different display methods. The display panel 100 has an outer surface 103 and a first end 101. Wherein the outer surface 103 is preferably a surface of the display panel 100 facing outside and displaying image. The outer surface 103 may or may not have additional optical films attached. The optical films may be polarizing films, protection films, anti-reflection films and so on. In this embodiment, the first end 101 may be a side region of the display panel 100 where the flexible connecting unit 150 is disposed. The first end 101 includes but is not limited to a side edge of the display panel 100 and the adjacent region. For example, in an embodiment, the first end 101 refers to a part of the side of the display panel 100 beyond the visible region where the flexible connecting unit 150 is disposed.

Figure 2:
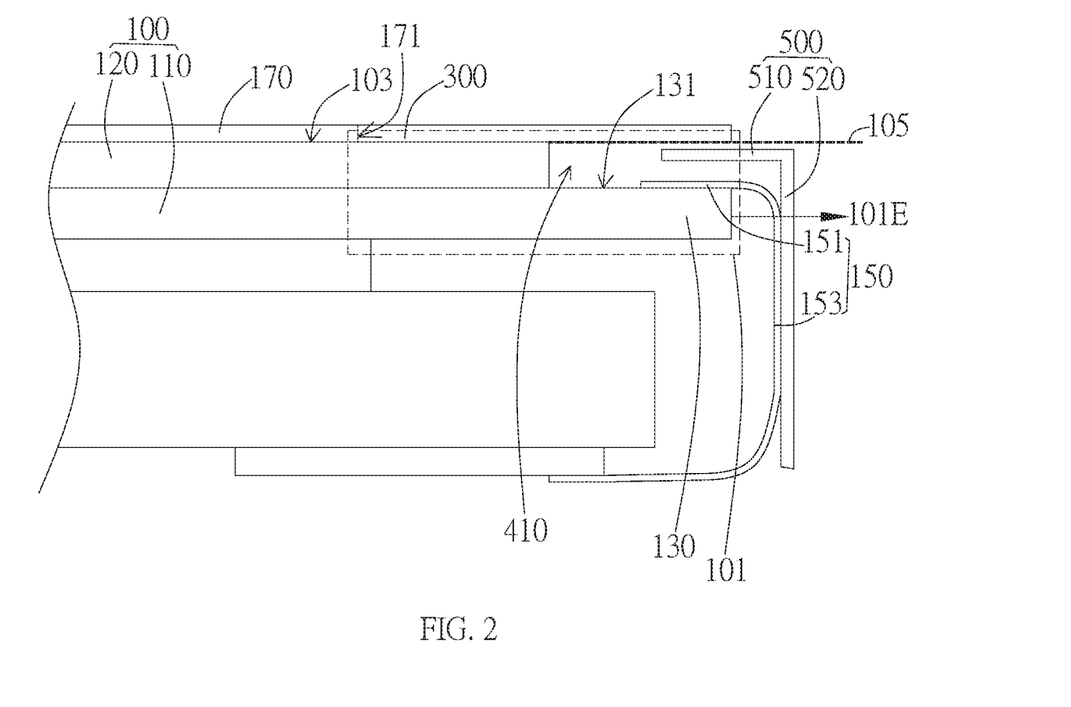
FIG. 2 is a section view according to the embodiment represented in FIG. 1.

As shown in FIG. 1, the display panel 100 comprises a first substrate 110, a second substrate 120 and a flexible connecting unit 150. The first substrate 110 is preferably a substrate of pixel circuit on which pixel electrodes and wires are disposed. The second substrate 120 is stacked on the first substrate 110. The outer surface 103 is formed on a surface of the second substrate 120 facing away from the first substrate 110. The area between the first substrate 110 and the second substrate 120 can be disposed with a liquid layer or other display elements with different properties based on the display method of the display panel 100. In the embodiment, the second substrate 120 is preferably a color filter layer substrate on which a color filter layer are disposed, corresponding to the pixel units of the first substrate 110, but not limited to the aforementioned; the films and components of the first substrate 110 and the second substrate 120 can be adjusted according to the need. FIG. 2 is a section view along the A-A line of the embodiment represented in FIG. 1. As shown in FIG. 1 and FIG. 2, at the location of the first end 101 of the display panel 100, the first substrate 110 has a protruding portion 130 extending beyond the second substrate 120. In other words, at the first end 101, the first substrate 110 is not flush with the second substrate 120 and the first substrate 110 is more protruding than the second substrate 120. The protruding portion 130 has a protruding surface 131. The protruding surface 131 is facing the virtual plane 105 formed by extending the outer surface 103. From another perspective, the protruding surface 131 and the outer surface 103 have the same facing direction. In particular, the virtual plane 105 is an imaginary plane extended from the outer surface 103 toward the outside to illustrate the relationship between the direction and the space, instead of an actually existing physical plane.

As shown in FIG. 1 and FIG. 2, an end of the flexible connecting unit 150 is connected to the protruding surface 131. In the embodiment, the flexible connecting unit 150 is formed by flexible circuit boards on which connecting wires and/or driving circuits may be disposed. As shown in FIG. 1, the flexible connecting unit 150 has, for example, a connection part 151 and a bending part 153. The connection part 151 can include a plurality of pins and be connected to the protruding surface 131 to create an electrical connection with the wires disposed on the second substrate 120. The bending part 153 is connected to the connection part 151 and bent toward a direction opposite to the facing direction of the protruding surface 131. For example, the bending part 153 is bent to the side opposite to the outer surface 103. In other words, the bending part 153 is connected to the connection part 151 and bent toward the direction away from the extension plate 300.

As shown in FIG. 1 and FIG. 2, the extension plate 300 is preferably of a strip shape and extended along the first end 101. The extension plate 300 is partially stacked on the outer surface 103. More specifically, the extension plate 300 is attached to a part of the outer surface 103 near the first end 101 by a glue layer. The extension plate 300 has other part protruding outside the outer surface 103 and stacked on the protruding portion 130 of the first substrate 110. However, the extension plate 300 can be stacked but not in direct contact with the protruding portion 130 of the first substrate 110, but form an interlayer in between to accommodate other components. More specifically, the flexible connecting unit 150 is disposed on the protruding surface 131. The gap 410 is formed between the extension plate 300 and the flexible connecting unit 150. Preferably, because the extension plate 300 is extended from the outer surface 103 to the outside, the extension plate 300 can partially cover the protruding surface 131 and/or the flexible connecting unit 150 to improve the appearance. Besides, in the embodiment, the outer surface 103 can have a polarizing film 170 attached, but not limited thereto. The extension plate 300 is flush and connected with the side 171 of the polarizing film 170 corresponding to the first end 101 and extending along the side 171 to provide a visual effect of a continuous plane between the extension plate 300 and the polarizing film 170. Preferably, the hardness of the extension plate 300 is greater than the hardness of the polarizing film 170 to make the part of the extension plate 300 extending outside the outer surface 103 more stiff.

Refer to FIG. 1 and FIG. 2, the first portion 510 of the spacing plate 500 is extended into the gap 410 and located between the flexible connecting unit 150 and the extension plate 300. In the embodiment, the first portion 510 has a strip shape and extends along the extending direction 101E of the first end 101. Through this arrangement, the spacing plate 500 can visually cover the protruding surface 131 and the flexible connecting unit 150 to provide a better appearance and visual effect. As shown in FIG. 2, the extending direction of the extension plate 300 away from the outer surface 103 and the extending direction of the first portion 510 of the spacing plate 500 toward the gap 410 are substantially parallel. Through this arrangement, when assembling the spacing plate 500 into the gap 410, the probability of interference caused by the extension plate 300 can be decreased. In addition, the hardness of the spacing plate 500 is preferably greater than the hardness of the polarizing film 170, but the hardness of the spacing plate 500 can be less than the hardness of the extension plate 300. Hence, the spacing plate 500 is more flexible and better at absorbing external forces produced by collisions or contact than the extension plate 300; it can also to decrease the risk of damaging or peeling off the extension plate 300 while assembling the display panel 100.

As shown in FIG. 1 and FIG. 2, the spacing plate 500 further has a second portion 520 connected to the first portion 510. In this embodiment, the second portion 520 is bent at an angle of, for example, 90 degrees relative to the first portion 510, but not limited thereto. As shown in FIG. 2, the bent second portion 520 is extended toward the direction away from the extension plate 300, that is, the direction towards the bottom of FIG. 2. Besides, as shown in FIG. 2, the first portion 510 and the second portion 520 can wrap around the flexible connecting unit 150 to reduce the probability of seeing the flexible connecting unit 150 from the outside by user.

Figure 3:
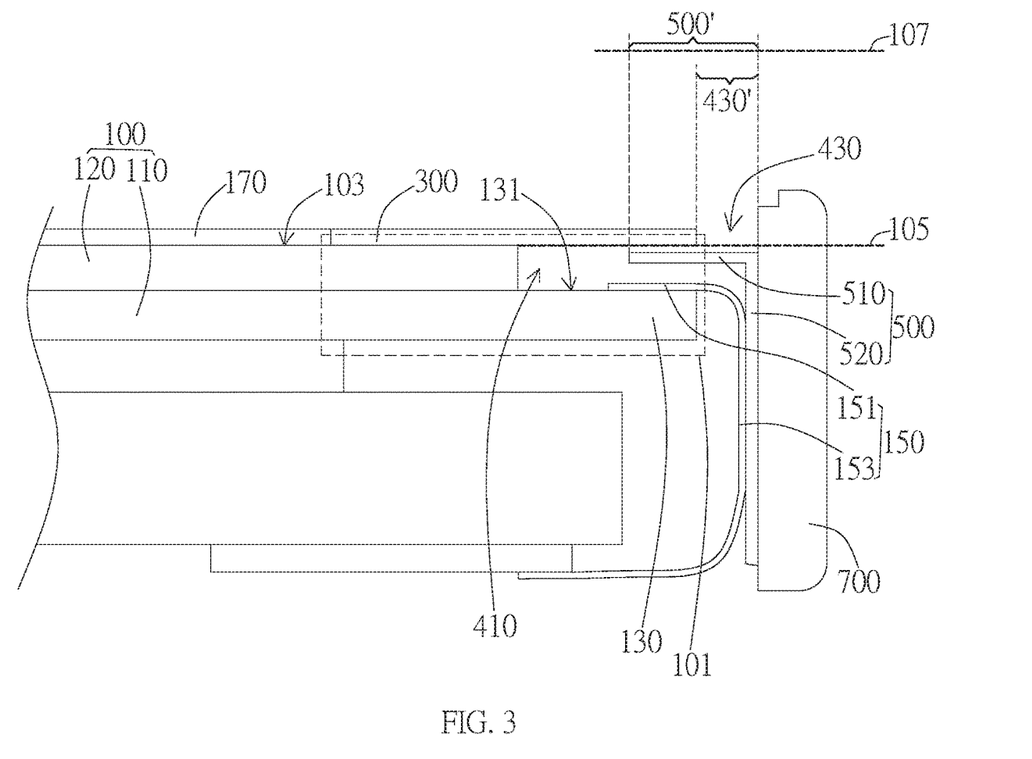
FIG. 3 is a section view of a display device according to an embodiment.

In the embodiment of FIG. 3, the display device further includes a frame body 700. The frame body 700 is disposed corresponding to the first end 101. Preferably, the frame body 700 can be but not limited to an outer frame of the display device. In consideration of assembly tolerance and other factors, the spacing 430 is formed between the end of the extension plate 300 facing the frame body 700 and the frame body 700. On the projection plane 107 parallel to the virtual plane 105, the projection area 500' of the spacing plate 500 at least partially overlaps with the projection area 430' of the spacing 430. Similar to the virtual plane 105, projection plane 107 is an imaginary plane parallel to the virtual plane 105 to illustrate the relationship between the direction and the space, instead of an actually existing physical plane. Through this arrangement, when a user observes the spacing 430 from the outside, the user will see the spacing plate 500, reducing the probability of seeing the flexible connecting unit 150 or other inner components. Moreover, in an embodiment, the second portion 520 can be disposed between the bending part 153 of the flexible connecting unit 150 and the frame body 700, and the second portion 520 can be jointed to the bending part 153 of the flexible connecting unit 150.

As shown in FIG. 3, the second portion 520 of the spacing plate 500 is attached to the inner surface of the frame body 700. In the assembly procedure, the first portion 510 can be inserted to the gap 410 when assembling the frame body 700 and the display panel 100 together. Preferably, the surface area of the second portion 520 is larger than the surface area of the first portion 510. With the larger attachment area, the second portion 520 can be firmly attached to the frame body 700. In addition, the hardness of the spacing plate 500 is preferably less than the hardness of the frame body 700. Hence, when inserting the first portion 510 into the gap 410, the probability of damaging other components can be reduced because of the flexibility of the spacing plate 500.

Figure 4:
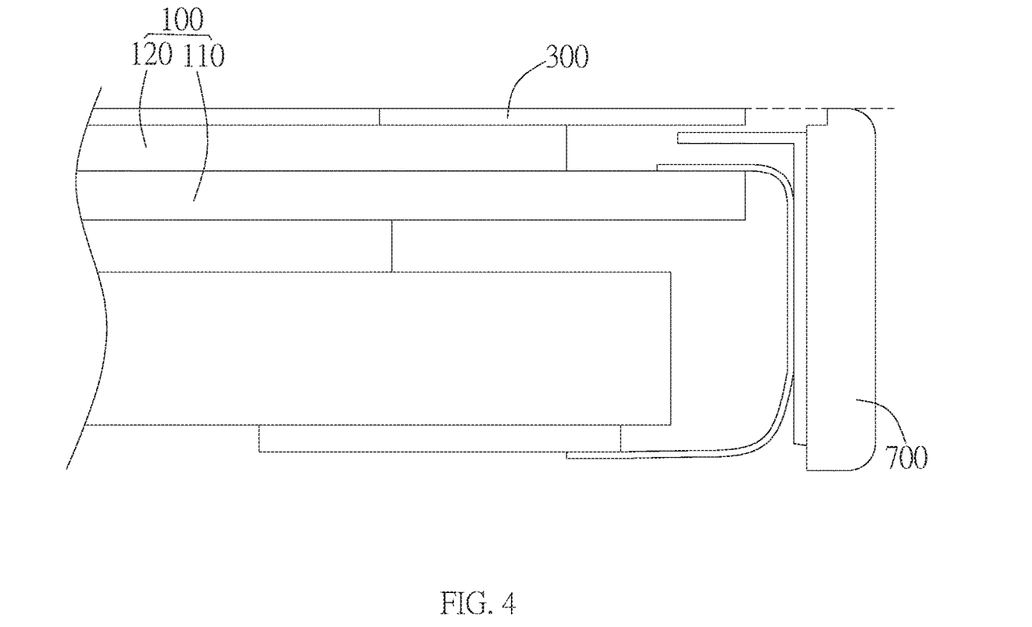
FIG. 4 is a section view of a modification of the embodiment represented in FIG. 3.

Besides, in the embodiment represented in FIG. 3, the top part of the frame body 700 is more protruding than the extension plate 300. Through the design, the frame body 700 can provide a better protection to the extension plate 300 and/or the display panel 100. However, in a different embodiment as shown in FIG. 4, the extension plate 300 can also be flush with the top part of frame body 700 to provide a better appearance and visual effect.

Figure 5:
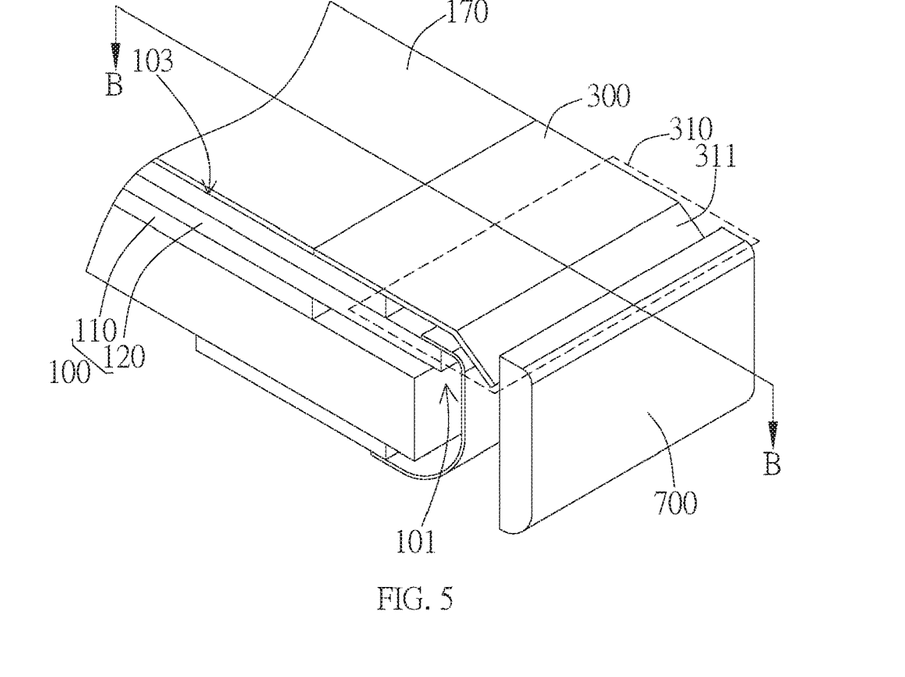
FIG. 5 is an exploded-view drawing of a display device according to an embodiment of the present invention.
Figure 6:
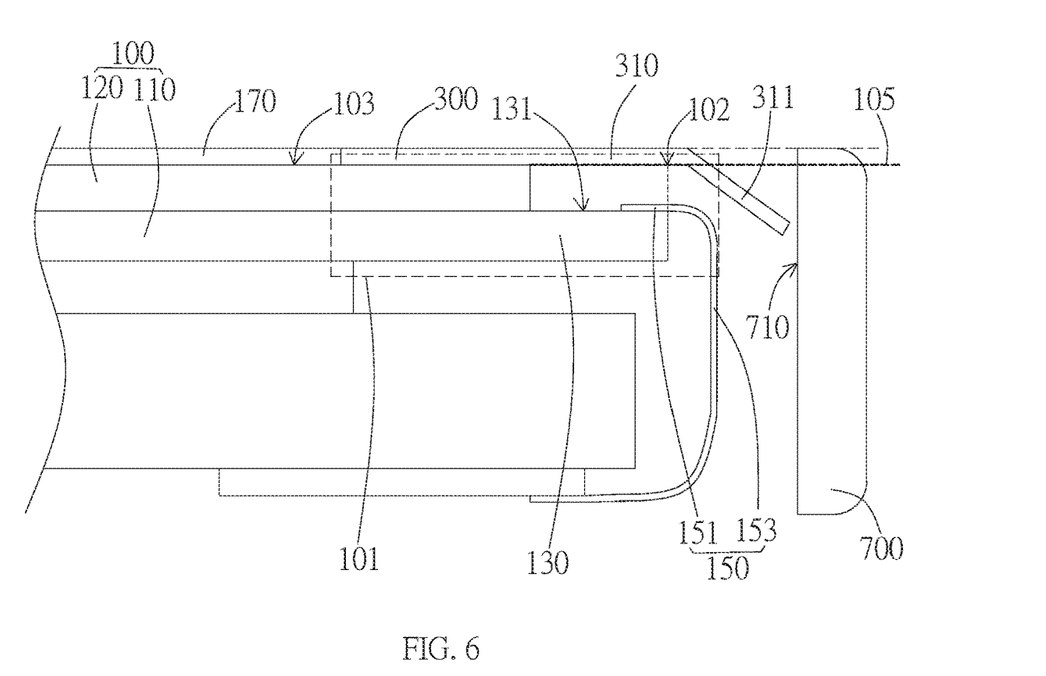
FIG. 6 is a section view according to the embodiment represented in FIG. 5.

FIG. 5 and FIG. 6 illustrate another embodiment of a display device of the present invention, wherein FIG. 5 is an exploded-view drawing of the display device according to the embodiment and the FIG. 6 is a section view of the embodiment in FIG. 5 along the B-B line. In the embodiment, the display device has a display panel 100, an extension plate 300 and a frame body 700. Similar to the aforementioned embodiment, the display panel 100 has an outer surface 103 and a first end 101. The extension plate 300 is partially stacked on a part of the outer surface 103 near the first end 101 and has an extension part 310 protruding outside the outer surface 103. The frame body 700 is disposed corresponding to the first end 101. In the embodiment, the frame body 700 is disposed on the outside of the first end 101 of the display panel 100. As shown in FIG. 5, at least a portion of the extension part 310 is bent toward the direction opposite to the facing direction of the outer surface 103 (the downward direction as shown in FIG. 5 and FIG. 6) to form a bending section 311. The bending section 311 is extended toward the frame body 700. More specifically, the bending section 311 is inclined toward the inside of the display panel 100 while extending toward the frame body 700.

Through this arrangement, when the frame body 700 presses against the top part of the extension plate 300 due to an external force, the external force will not be directly and completely transferred to the display panel 100. The bending section 311 can eliminate a part of the external force transferred to the display panel 100 with its inclination angle. In addition, the bending section 311 also can be further bent to absorb a part of the impact. In the meanwhile, the extension plate 300 still preserves the function of preventing the user from seeing the inner components of the display device to improve the appearance of the display device. In the embodiment, as shown in FIG. 6, the non-bending portion of the extension part 310 is flush with the top part of the frame body 700 to further provide a better appearance.

As shown in FIG. 5 and FIG. 6, in the embodiment, the display panel 100 comprises a first substrate 110, a second substrate 120 and a flexible connecting unit 150. The second substrate 120 is stacked on the first substrate 110. The outer surface 103 is formed on a surface of the second substrate 120 facing away from the first substrate 110. As shown in FIG. 5 and FIG. 6, the first substrate 110 has a protruding portion 130 extending beyond the second substrate 120 at the first end 101 of the display panel 100. In other words, the first substrate 110 is not flush with the second substrate 120 at the first end 101, and the first substrate 110 is more protruding than the second substrate 120. The protruding portion 130 has a protruding surface 131 facing the virtual plane 105 formed by extending the outer surface 103. To put it in another way, the protruding surface 131 and the outer surface 103 have the same facing direction. In particular, the virtual plane 105 is an imaginary plane extended from the outer surface 103 toward the outside to illustrate the relationship between the direction and the space, instead of an actually existing physical plane. As shown in FIG. 6, the vertical projection 102 of the side edge of the first end 101 of the display panel 100 (the side edge of the protruding portion 130 of the first substrate 110 in the embodiment) on the extension plate 300 preferably falls on the non-bending portion of the extension part 310.

Refer to FIG. 5 and FIG. 6, an end of the flexible connecting unit 150 is connected to the protruding surface 131. In the embodiment, the flexible connecting unit 150 is formed by flexible circuit boards on which connecting wires and/or driving circuits may be disposed. As shown in FIG. 6, the flexible connecting unit 150 has a connection part 151 and a bending part 153. The connection part 151 can include a plurality of pins and be connected to the protruding surface 131 to create an electrical connection with the wires disposed on the second substrate 120. The bending part 153 is connected to the connection part 151 and bent toward the direction opposite the facing direction of the protruding surface 131. For example, the bending part 153 is bent to the side opposite the outer surface 103. The connection part 151 is located between the protruding surface 131 and the extension part 310. In addition, in the embodiment, the polarizing film 170 is attached to the outer surface 103 but not limited thereto. The extension plate 300 is flush with and connected to the side 171 of the first end 101 corresponding to the polarizing film 170 and extended along the side 171 to provide the visual effect of a continuous plane. Preferably, the hardness of the extension plate 300 is greater than the hardness of the polarizing film 170 to make the part of the extension plate 300 extending outside the outer surface 103 more stiff.

Figure 7:
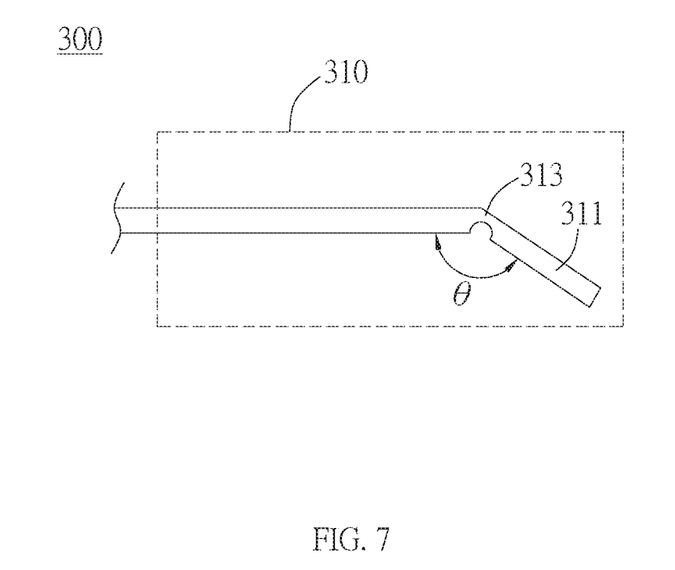
FIG. 7 is a section view of an extension plate according to an embodiment.

As shown in FIG. 7, the bending section 311 and the non-bending portion of the extension part 310 preferably have a flat strip structure and are connected to each other by the long side of the structure with the angle θ. The degree of angle θ is preferably in the range between 120° to 150° to have the functions of eliminating impact and improving appearance. In addition, the rigidity of the connection site 313 between the bending section 311 and the non-bending portion of the extension part 310 is preferably less than the rigidity of the other portion of the extension part 310. Hence, when a force is applied to the bending section 311, the connection site 313 will provide a larger degree of bending first. In an embodiment, a weakening treatment, e g making a perforated line or a pre-scored line and so on, can be applied to the connection site 313.

Figure 8:
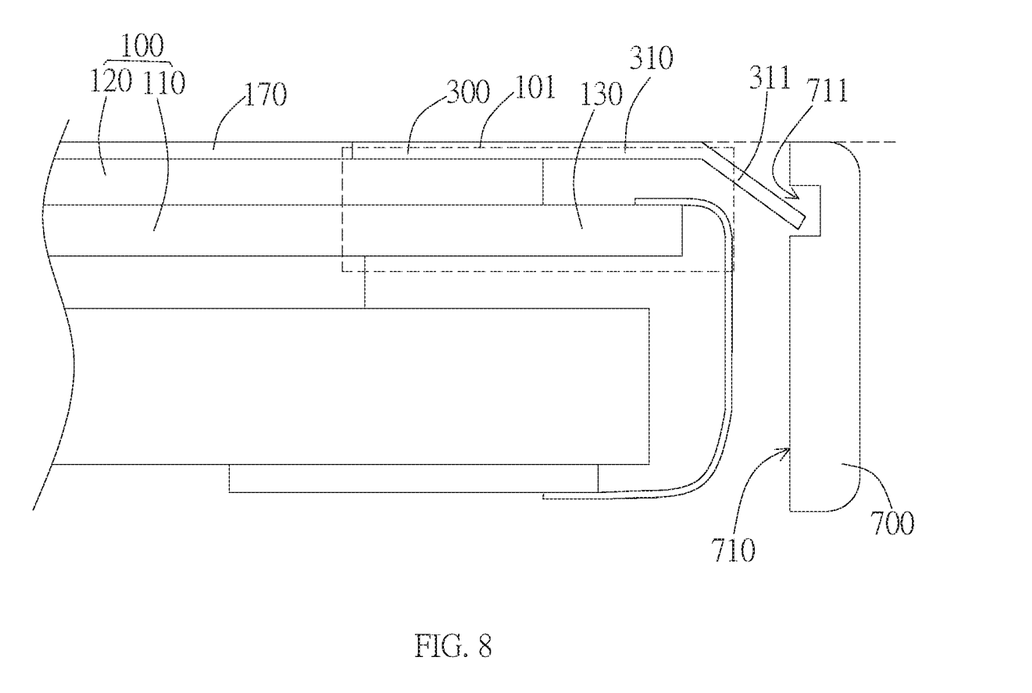
FIG. 8 is a section view of a display device according to an embodiment.

In the embodiment as shown in FIG. 8, the frame body 700 has an inner wall 710. The inner wall 710 faces the first end 101. The recess 711 is formed on the inner wall. In the embodiment, the recess 711 is of a strip shape and extending along the extending direction of the first end 101. As shown in FIG. 8, the bending section 311 extends toward the recess 711. The top part of the bending section 311 is preferably inserted into the recess 711 but not limited thereto. Through the design, when the frame body 700 faces the bending section 311 due to an external force, the bending section 311 will be inserted deeply into the recess 711 first instead of directly contacting the inner wall 710 of the frame body 700. When the top part of the bending section 311 contacts the inner surface or the bottom surface of the recess 711, the bending section 311 will start to experience the external force and obtain more buffer space. Accordingly, the bending section 311 can be closer to the frame body 700 or even be inserted inside the recess 711. Hence, it would be harder to see the flexible connecting unit 150 and other components disposed on the inner side of the extension plate 300 from the appearance.

Figure 9:
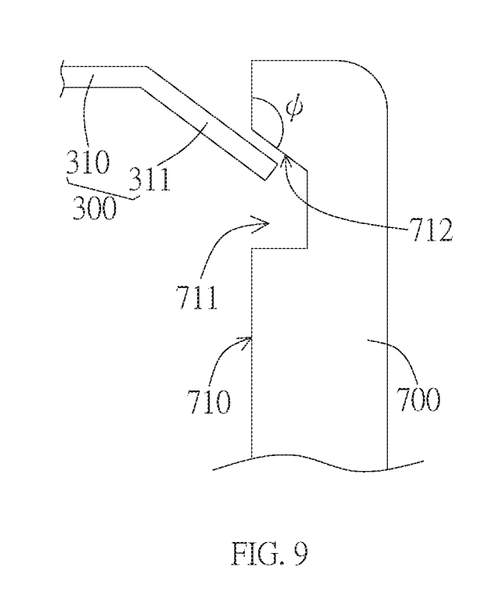
FIG. 9 and FIG. 10 are section views of a frame body according to different embodiments.
Figure 10:
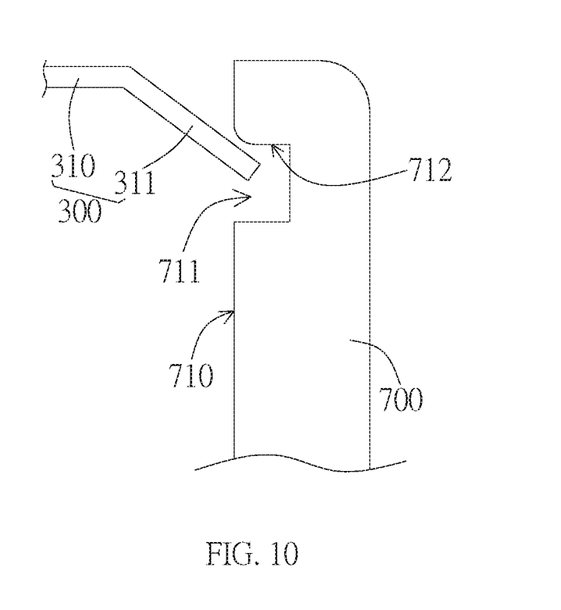

In the embodiment as shown in FIG. 9, the recess 711 has a first slot wall 712 extending along the long direction of the recess 711. The first slot wall 712 is connected to the inner wall 710. The obtuse angle φ is formed between the first slot wall 712 and the inner wall 710. In other words, the first slot wall 712 forms a sloping wall and preferably parallel with the bending section 311. The design will provide a larger buffer space between the bending section 311 and the frame body 700. In addition, the first slot wall 712 can guide the bending section 311. In the embodiment as shown in FIG. 10, the first slot wall 712 can also be perpendicular to the inner wall 710 but a fillet can be optionally formed at the connection site between the first slot wall 712 and the inner wall 710. This arrangement can provide more buffer space between the bending section 311 and the frame body 700.

Figure 11:
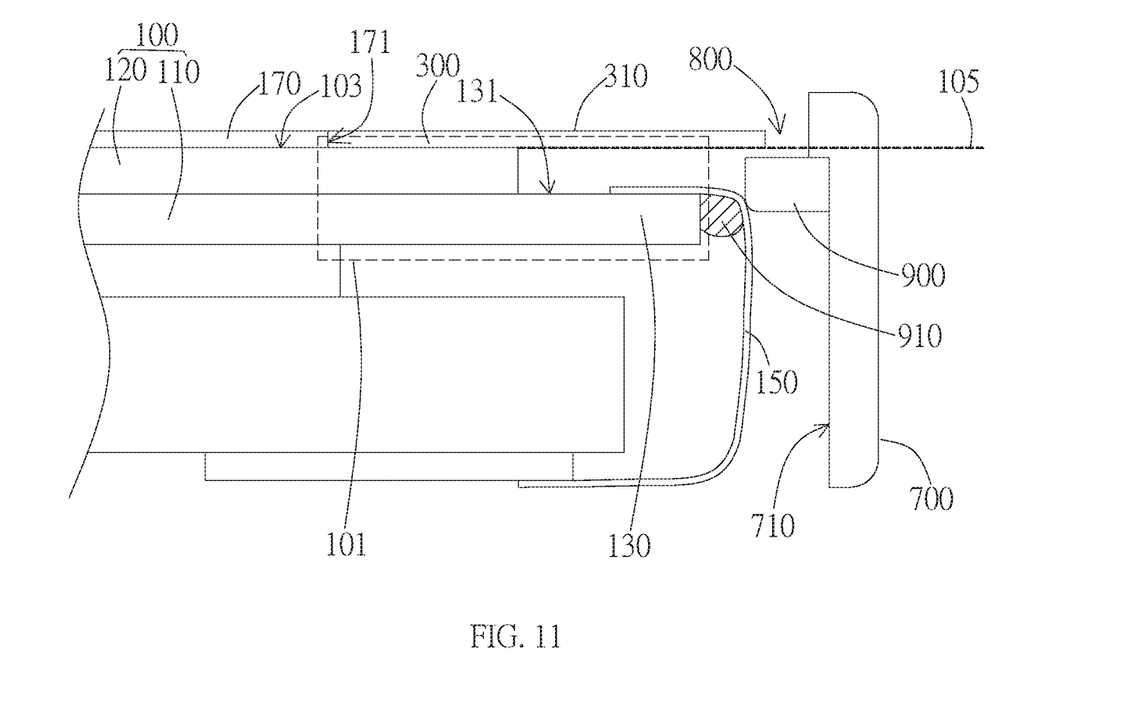
FIG. 11 is a section view of a display device according to an embodiment.

FIG. 11 shows a display device according to an embodiment. In the embodiment, the display device has a display panel 100, an extension plate 300, a frame body 700, and a buffer material 900. Similar to the aforementioned embodiment, the display panel 100 has an outer surface 103 and a first end 101. The extension plate 300 is partially stacked on a portion of the outer surface 103 near the first end 101 and has an extension part 310 protruding outside the outer surface 103. The frame body 700 is disposed corresponding to the first end 101. In the embodiment, the frame body 700 is disposed outside of the first end 101 of the display panel 100. The clearance 800 is formed between the frame body 700 and the end part of the extension part 310. As shown in FIG. 11, the frame body 700 has an inner wall 710. The buffer material 900 is disposed between the inner wall 710 and the first end 101. The hardness of the frame body 700 is preferably greater than the hardness of the buffer material 900. Hence, the buffer material 900 will not easily crush the first end 101 of the display panel 100 or the flexible connecting unit 150. In addition, the buffer material 900 can have a strip shape and be disposed along the first end or can be block shapes and disposed along the first end.

Figure 12:
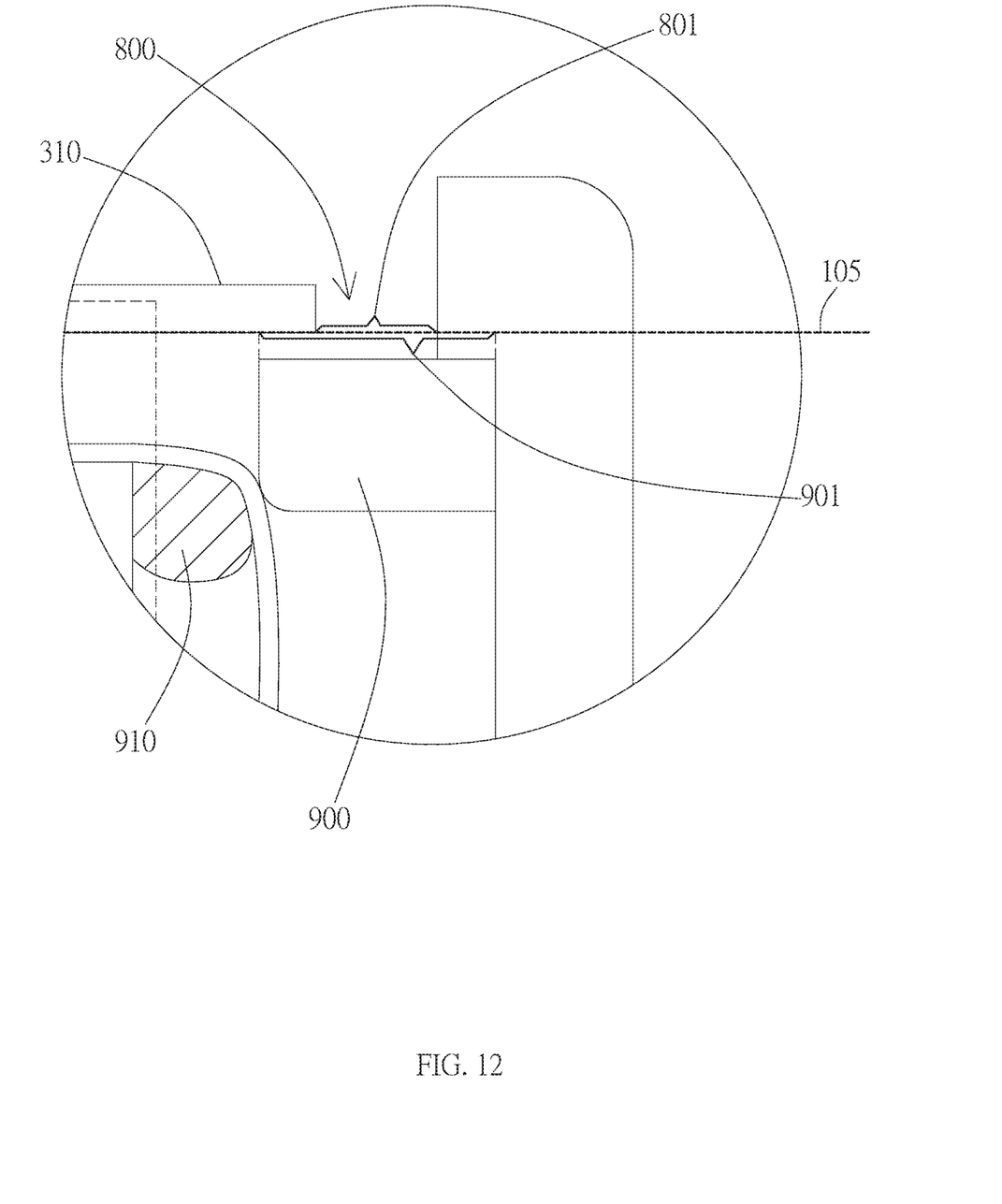
FIG. 12 is a partial-enlarged drawing according to the embodiment represented in FIG. 11.

FIG. 12 is a partially-enlarged drawing according to the embodiment shown in FIG. 11. As shown in FIG. 11 and FIG. 12, on the virtual plane 105 formed by extending the outer surface 103, the buffer material 900 has a first projection area 901 and the clearance 800 has a second projection area 801. Wherein the first projection area 901 partially overlaps the second projection area 801. With this arrangement, when the user views the clearance 800 from the outside, the buffer material 900 can cover the components inside the clearance 800, such as the flexible connecting unit 150, to improve the appearance.

As shown in FIG. 11, in the embodiment, the display panel 100 comprises a first substrate 110, a second substrate 120 and a flexible connecting unit 150. The second substrate 120 is stacked on the first substrate 110. The outer surface 103 is formed on the surface of the second substrate 120 facing away from the first substrate 110. As shown in FIG. 11, at the location of the first end 101 of the display panel 100, the first substrate 110 has a protruding portion 130 extending beyond the second substrate 120. In other words, at the first end 101, the first substrate 110 is not flush with the second substrate 120 and the first substrate 110 is more protruding than the second substrate 120. The protruding portion 130 has a protruding surface 131. The protruding surface 131 faces the virtual plane 105 formed by extending the outer surface 103. From another perspective, the protruding surface 131 and the outer surface 103 have the same facing direction. In particular, the virtual plane 105 is an imaginary plane extended from the outer surface 103 toward the outside to illustrate the relationship between the direction and the space, instead of an actually existing physical plane. In addition, in the embodiment, a polarizing film 170 is attached to the outer surface 103 but not limited thereto. The extension plate 300 is flush with the side 171 of the polarizing film 170 corresponding to the first end 101 and extending along the side 171 to provide a visual effect of a continuous plane between the extension plate 300 and the polarizing film 170. Preferably, the hardness of the extension plate 300 is greater the hardness of the polarizing film 170 to make the part of the extension plate 300 extending outside the outer surface 103 more stiff.

As shown in FIG. 11, a side of the flexible connecting unit 150 is connected to the protruding surface 131. In the embodiment, the flexible connecting unit 150 is formed by flexible circuit boards on which connecting wires and/or driving circuits may be disposed. As shown in FIG. 11, the flexible connecting unit 150 is located between the buffer material 900 and the side edge of the first substrate 110. The buffer material 900 at least partially contacts the flexible connecting unit 150 to prevent the flexible connecting unit 150 from extending into the clearance 800 and being seen. Because of the greater flexibility of the buffer material 900, the flexible connecting unit 150 will not be easily damaged. As shown in FIG. 11 and FIG. 12, the gel 910 can be optionally disposed on the side of the connecting unit 150 facing away from the buffer material 900. The gel 910 is located near the connection site between the flexible connecting unit 150 and the protruding surface 131. More specifically, the gel 910 is disposed in a slot formed between the flexible connecting unit 150 and the edge of the first substrate 110. In the embodiment, the shape of the slot can be but not limited to U-shape, V-shape or other shapes. With this arrangement, when the buffer material 900 presses against the flexible connecting unit 150, the gel 910 can support the flexible connecting unit 150 to reduce the probability of damaging or cracking the flexible connecting unit 150 along the end of the first substrate 110.

Although the present invention discloses the aforementioned embodiments, it is not intended to limit the invention. Any person who is skilled in the art in connection with the present invention can make any change or modification without departing from the spirit and the scope of the present invention. Therefore, the scope of protection of the present invention should be determined by the claims in the application.

What is claimed is:

1. A display device, comprising:
a display panel having an outer surface and a first end, wherein the display panel comprises:
a first substrate;
a second substrate stacked on the first substrate, the outer surface formed on a surface of the second substrate facing away from the first substrate, wherein the first substrate having a protruding portion extending beyond the second substrate at the first end of the display panel, and the protruding portion has a protruding surface facing a virtual plane formed by extending the outer surface; and
a flexible connecting unit connected to the protruding surface;
an extension plate partially stacked on the outer surface and partially extended out of the outer surface to be stacked on the protruding portion of the first substrate, a gap formed between the extension plate and the flexible connecting unit; and
a spacing plate having a first portion extending into the gap to be located between the flexible connecting unit and the extension plate;
wherein the display panel comprises a polarizing film attached to the outer surface; the extension plate extends along a side of the polarizing film, wherein a hardness of the spacing plate is greater than a hardness of the polarizing film.

2. The display device of claim 1, wherein an extending direction of the extension plate away from the outer surface and an extending direction of the first portion of the spacing plate toward the gap are substantially parallel.

3. The display device of claim 1, further comprising a frame body disposed corresponding to the first end of the display panel, wherein a spacing is formed between the extension plate and the frame body; the spacing plate at least partially overlaps with the spacing on a projection plane parallel to the virtual plane.

4. The display device of claim 3, wherein the spacing plate has a hardness smaller than a hardness of the frame body.

5. The display device of claim 3, wherein the spacing plate has a second portion connected to the first portion, the second portion is bent relative to the first portion, the second portion is connected to the frame body, and the second portion extends away from the extension plate.

6. The display device of claim 5, wherein the flexible connecting unit has a connection part and a bending part, the connection part is connected to the protruding surface of the first substrate, the bending part is connected to the connection part and extends away from the extension plate, and the second portion is located between the bending part of the flexible connection unit and the frame body.

7. The display device of claim 5, wherein a surface area of the second portion of the spacing plate is larger than a surface area of the first portion.

8. The display device of claim 3, wherein the extension plate is flushed with a top of the frame body.

9. The display device of claim 1, wherein the extension plate has a hardness greater than a hardness of the spacing plate.

10. A display device, comprising:
a display panel having an outer surface and a first end;
an extension plate partially stacked on a part of the outer surface near the first end, the extension plate having an extension part protruding outside the outer surface; and
a frame body disposed corresponding to the first end;
wherein at least a portion of the extension part is bent toward a direction opposite to a facing direction of the outer surface to form a bending section; the bending section extends toward the frame body;
wherein the display panel comprises a polarizing film attached to the outer surface; the extension plate extends along a side of the polarizing film, wherein the extension plate has a hardness greater than a hardness of the polarizing film.

11. The display device of claim 10, wherein the frame body has an inner wall facing toward the first end, an inner recess is formed on the inner wall, the inner recess extends along the first end, and the bending section extends toward the inner recess.

12. The display device of claim 11, wherein an end of the bending section extends into the inner recess.

13. The display device of claim 10, wherein an angle is included between the bending section and a non-bending portion of the extension part, and the angle is between 120 degrees and 150 degrees.

14. The display device of claim 10, wherein a vertical projection of an edge of the first end on the extension plate falls on a non-bending portion of the extension part.

15. The display device of claim 10, wherein a non-bending portion of the extension part is flushed with the frame body.

16. The display device of claim 10, wherein the display panel comprises:
a first substrate;
a second substrate stacked on the first substrate, the outer surface formed on a surface of the second substrate facing away from the first substrate, wherein the first substrate has a protruding portion extending beyond the second substrate at the first end of the display panel, and the protruding portion has a protruding surface facing a virtual plane formed by extending the outer surface; and
a flexible connection unit having a connection part connected to the protruding surface, the connection part located between the protruding surface and the extension part of the extension plate.

17. A display device, comprising:
a display panel having an outer surface and a first end;
an extension plate partially stacked on a part of the outer surface near the first end, the extension plate having an extension part protruding outside the outer surface;
a frame body disposed corresponding to the first end, the frame body having an inner wall, wherein a clearance formed between an end of the extension part and the frame body; and
a buffer material disposed between the inner wall and the first end,
wherein on a virtual plane formed by extending the outer surface, the buffer material has a first projection area and the clearance has a second projection area; the first projection area at least partially overlaps the second projection area.

18. The display device of claim 17, wherein the frame body has a hardness greater than a hardness of the buffer material.

19. The display device of claim 17, wherein the display comprises:
a first substrate;
a second substrate stacked on the first substrate, the outer surface formed on a surface of the second substrate facing away from the first substrate, wherein the first substrate has a protruding portion extending beyond the second substrate at the first end of the display panel, and the protruding portion has a protruding surface facing the virtual plane; and
a flexible connection unit connected to the protruding surface and located between the buffer material and an edge of the first substrate, at least a portion of the buffer material contacts the flexible connection unit.

20. The display device of claim 19, wherein the display panel further comprises a gel disposed on a side of the flexible connection unit facing away from the buffer material, and the gel neighbors a location where the flexible connection unit is connected to the protruding surface.

21. The display device of claim 17, wherein the display panel comprises a polarizing film attached to the outer surface; the extension plate extends along a side of the polarizing film, wherein the extension plate has a hardness greater than a hardness of the polarizing film.

* * * * *